United States Patent
Patak

(10) Patent No.: US 8,866,473 B2
(45) Date of Patent: Oct. 21, 2014

(54) MAGNETIC FIELD SENSOR DEVICE, CORRESPONDING PRODUCTION METHOD, AND MAGNETIC FIELD MEASURING METHOD

(75) Inventor: Christian Patak, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 564 days.

(21) Appl. No.: 13/183,030

(22) Filed: Jul. 14, 2011

(65) Prior Publication Data
US 2012/0019241 A1   Jan. 26, 2012

(30) Foreign Application Priority Data
Jul. 22, 2010   (DE) .......................... 10 2010 038 287

(51) Int. Cl.
| | |
|---|---|
| G01R 33/02 | (2006.01) |
| B82Y 25/00 | (2011.01) |
| G01R 33/04 | (2006.01) |
| H01F 1/153 | (2006.01) |
| H01F 10/32 | (2006.01) |

(52) U.S. Cl.
CPC ............. *G01R 33/04* (2013.01); *B82Y 25/00* (2013.01); *H01F 10/325* (2013.01); *H01F 1/15391* (2013.01)
USPC ......................................................... 324/244

(58) Field of Classification Search
USPC ......................................................... 324/244
See application file for complete search history.

(56) References Cited

U.S. PATENT DOCUMENTS 7,538,337 B2 * 5/2009 Hijzen et al. ...................... 257/3

FOREIGN PATENT DOCUMENTS

| AT | WO 2008017090 | * 2/2008 |
|---|---|---|
| DE | 10 2007 03229 | 1/2009 |

OTHER PUBLICATIONS

Parkin et al., Science 11, vol. 320, No. 5873, pp. 190-194, Apr. 2008, Magnetic domain wall racetrack memory.

* cited by examiner

*Primary Examiner* — Reena Aurora
(74) *Attorney, Agent, or Firm* — Kenyon & Kenyon LLP

(57) ABSTRACT

A magnetic field sensor device and a corresponding production method are described. The magnetic field sensor device includes a substrate, which has a trench, a ferromagnetic nanowire formed in the trench, a first electrical connection for the electrical connection of a first end of the ferromagnetic nanowire, a second electrical connection for the electrical connection of a second end of the ferromagnetic nanowire, and a magnetic field detection device for detecting a magnetic field in the region of the nanowire.

12 Claims, 2 Drawing Sheets

A-A'

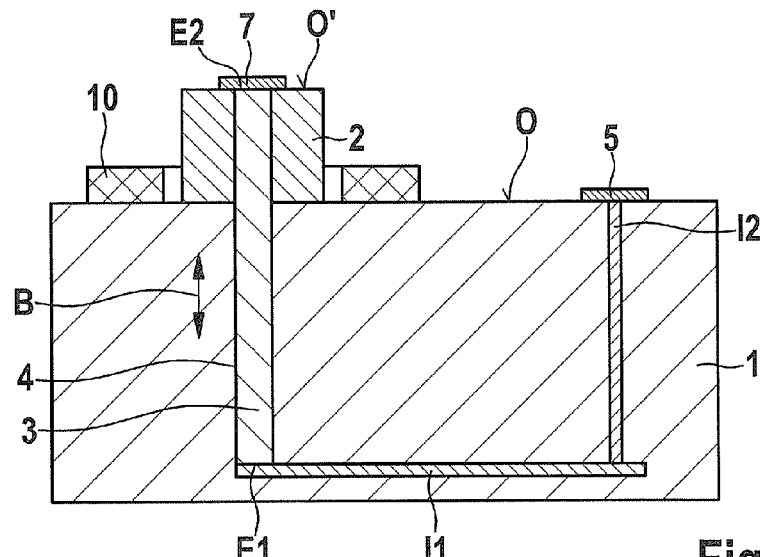
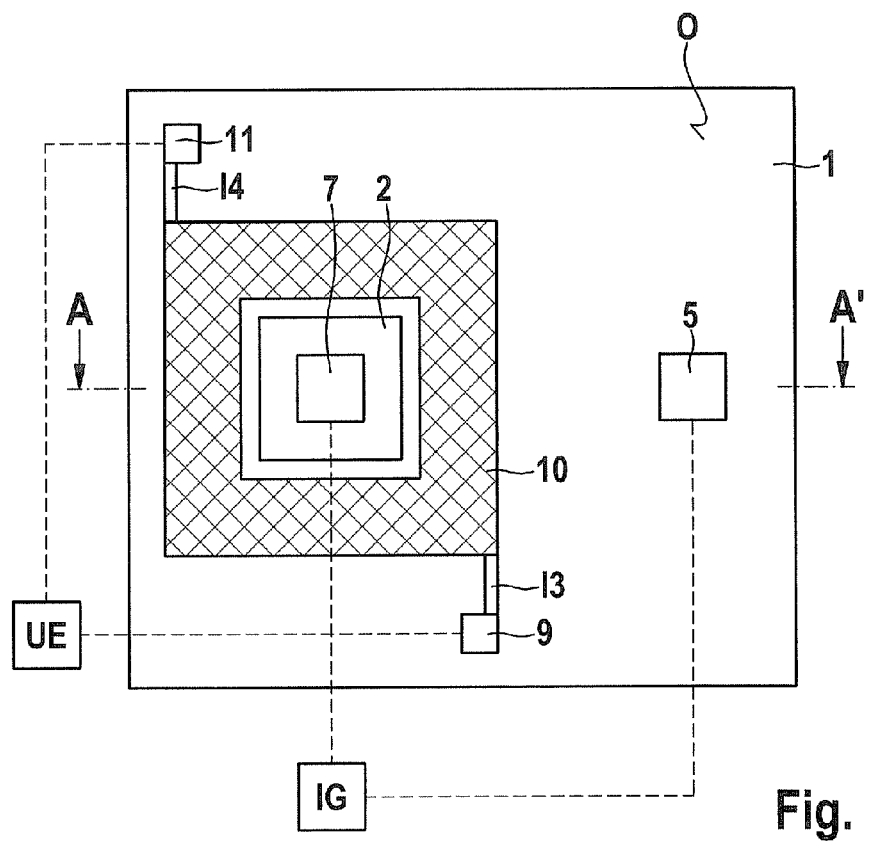
Fig. 1a
A-A'
Fig. 1b

A-A'

MAGNETIC FIELD SENSOR DEVICE, CORRESPONDING PRODUCTION METHOD, AND MAGNETIC FIELD MEASURING METHOD

RELATED APPLICATION INFORMATION

The present application claims priority to and the benefit of German patent application no. 10 2010 038 287.6, which was filed in Germany on Jul. 22, 2010, the disclosure of which is incorporated herein by reference.

FIELD OF THE INVENTION

The present invention relates to a magnetic field sensor device, to a corresponding production method and to a magnetic field measuring method.

BACKGROUND INFORMATION

Magnetic field sensor devices in the form of flux gates are discussed in the related art. In the case of flux gates, magnetically soft cores are periodically driven to an opposite saturation. The cores are wound with two receiver coils wound in opposite directions, so that, in the absence of a field, the induced voltages in both coils cancel each other. If a magnetic field is then applied, the vectorial component in the direction of the cores produces a resulting signal in the receiver coils that is proportional to the applied field.

German patent document DE 10 2007 032 299 A1 discusses such a magnetic field sensor device having a flux gate sensor, which is made up of an excitation coil, an induction coil and a magnetic core, the core consisting of a layer stack of magnetically soft layers disposed in alternation next to each other, and antiferromagnetic layers pinning them.

In the field of magnetic data storage a method for the direct variation of the magnetization of a nanowire by electrical current is discussed in Parkin et al, Science 11, Vol. 320, No. 5873, pages 190-194, April 2008. According to this method, different bits are serially written in a nanowire having a width of a few 100 nm, and read out again by local spin valves.

SUMMARY OF THE INVENTION

Although applicable to a variety of micromechanical components, the present invention and the background on which it is based are elucidated with regard to micromechanical sensor devices implemented through silicon technology.

The magnetic field sensor device as described herein, the corresponding production method as described herein and the magnetic field measuring method as described herein have the advantage that they allow the construction of a magnetic field sensor device according to the flux gate principle in any direction, in particular in the z-direction, that is to say, perpendicular to the substrate plane. A miniaturized system may be produced in thin-film technology, such as on a silicon substrate base, for example.

The idea on which the exemplary embodiments and/or exemplary methods of the present invention is based is to move magnetic domains in one or more nanowires by an electrical current. Thus, the usually required coil for reversing the magnetization of the magnetic core is dispensed with, since this takes place directly via the electrical current. For example, the readout may be performed via a spin valve, a pickup coil or some other magnetic field detection device in the vicinity of the nanowire(s).

The features indicated in the further descriptions herein relate to advantageous further refinements and improvements of the subject matter of the present invention.

Exemplary embodiments of the present invention are depicted in the drawings and explained in greater detail in the description below.

BRIEF DESCRIPTION OF THE DRAWINGS

FIG. 1a shows a schematic illustration to elucidate one specific development of the magnetic field sensor device according to the present invention, i.e., FIG. 1a, in a cross-section A-A'.

FIG. 1b shows a schematic illustration to elucidate one specific development of the magnetic field sensor device according to the present invention, i.e., FIG. 1b, in a plan view from above.

DETAILED DESCRIPTION

Figure 2A:
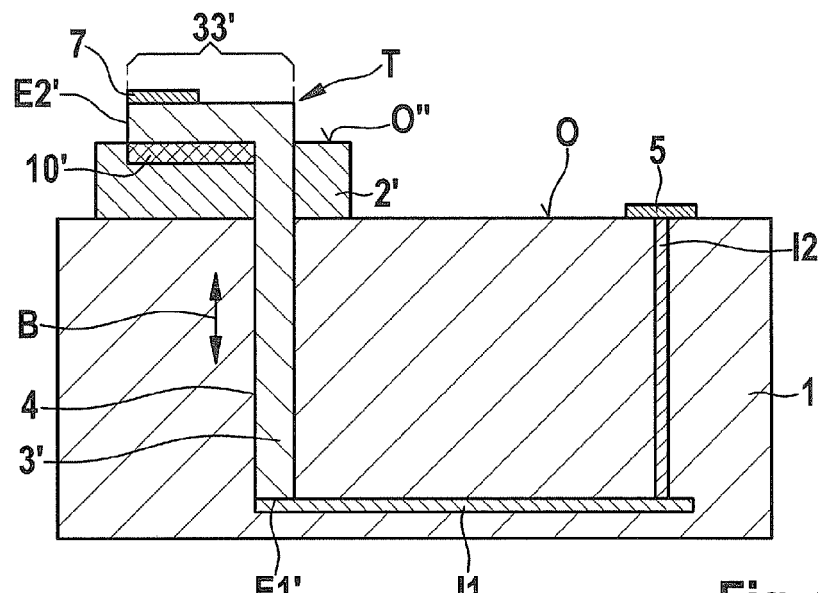
FIG. 2a shows a schematic illustration to elucidate one further specific development of the magnetic field sensor device according to the present invention, i.e., FIG. 2a, in a cross-section A-A'.

In the figures, identical reference symbols denote identical or functionally corresponding elements.

FIGS. 1a,b are schematic illustrations to elucidate a specific development of the magnetic field sensor device according to the present invention, to wit, FIG. 1a, in a cross-section A-A', and FIG. 1b, in a plan view from above.

In FIG. 1a,b, reference numeral 1 denotes a silicon substrate. Buried circuit tracks 11, 12, which lead to a first electrical connection 5 situated on top surface O, are provided within silicon substrate 1.

In addition, a trench 4 is provided in silicon substrate 1, e.g., by a known trench-etching process. Moreover, on top surface O of silicon substrate 1, above trench 4, there is a pedestal 2 where trench 4 continues.

A nanowire 3 of nanocrystalline or amorphous Ni—Fe is formed in trench 4, e.g., by way of a sputtering process or a galvanic deposition method, the nanowire typically having a diameter of 10 to a few 100 nm.

Beginning at its first end E1, which is in electrical contact with buried circuit track 11, nanowire 3 extends perpendicularly, i.e., in the z-direction, through substrate 1 up to its second end E2, which lies on top surface O' of pedestal 2. In electrical connection with nanowire 3, a second electrical connection 7 is formed on top surface O' of pedestal 2.

Pedestal 2 is surrounded by a planar pickup coil 10 in thin-film technology, which has a third electrical connection 9 connected via a circuit track 13, and a fourth electrical connection 11 connected via a circuit track 14, on top surface 0 of silicon substrate 1. Pickup coil 10 functions as magnetic field detection device and for this purpose is electrically connected at electrical connections 9 and 11 to an induction voltage measuring device UE.

A current generation device IG supplies a high-frequency pulsed current, which periodically reverses the magnetization of nanowire 3. The alternating currents impressed by current generation device IG usually have an amplitude in the milli-Ampere range.

In the process, a domain wall moves perpendicularly through nanowire 3 because the greater dispersion of the electrons at the domain wall results in a force on the wall. This wall movement is inhibited or amplified by an external magnetic field to be measured, e.g., via a change in the domain wall jump width per pulse, or via the required pulse intensity until the magnetization reversal sets in, so that the external magnetic field is able to be determined from the time-variable magnetic field B induced in pickup coil 10, once a calibration without external magnetic field has been performed, such as beforehand, for instance.

In order to increase the signal-to-noise ratio, it may be useful for the magnetic field detection to use a greater number of nanowires extending in parallel through the substrate in the z-direction.

Although induction voltage detection device UE and current generation device IG are provided outside of silicon substrate 1 in the example of FIG. 1, additionally they may also be integrated in silicon substrate 1 in the individual case.

Figure 2B:
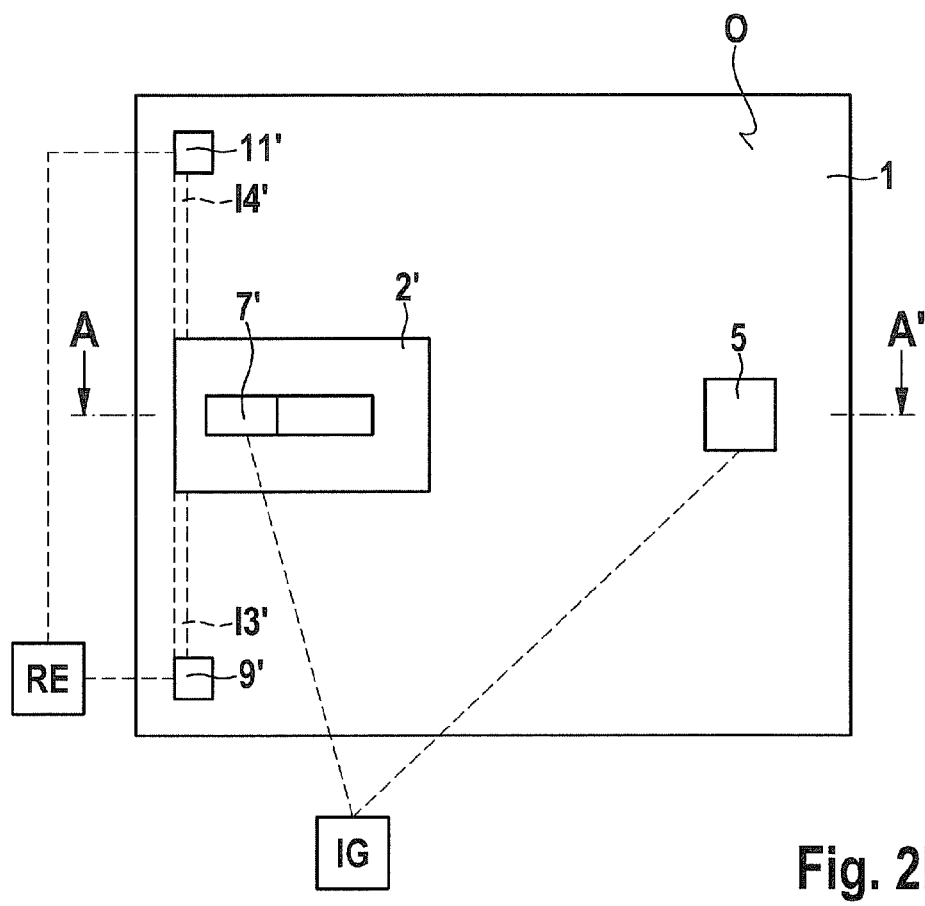
FIG. 2b shows a schematic illustration to elucidate one further specific development of the magnetic field sensor device according to the present invention, i.e., FIG. 2b, in a plan view from above.

FIG. 2a,b are schematic illustrations to elucidate one further specific development of the magnetic field sensor device according to the present invention, to wit, FIG. 2a, in a cross-section A-A', and FIG. 2b, in a plan view from above.

In the specific development according to FIG. 2a, buried circuit tracks L1, L2 and first electrical connection 5 provided on top surface O are identical to the above specific development.

In contract thereto, however, a nanowire 3' is provided in this second specific development, which, on top surface O2' of a modified, that is to say, flatter and broader, pedestal 2' has a bend T such that a region 33' situated in the vicinity of second end E2' of nanowire 3' in essence extends parallel to top surface O of silicon substrate 1. As a consequence, nanowire 3' has an inverted L-shape. In modified pedestal 2', underneath region 33', a spin valve 10' is provided, which is connected to a corresponding electrical connection 9' and 11' by way of circuit tracks 13', 14'. In this specific development, second electrical connection 7' is provided in region 33' on the top surface of nanowire 3'.

As with the first specific development, a current generation device IG is connected to electrical connections 5' and 7' in order to supply the alternating current for reversing the magnetization of nanowire 3'.

Electrical connections 9' and 11' are connected to a resistance detection device RE, which measures the electrical resistance of the spin valve, which changes under the influence of the time-variable magnetic field B, thereby making it possible to determine an existing external magnetic field, as previously described already.

Although the present invention has been described above with reference to the exemplary embodiments, it is not limited thereto but is modifiable in many ways.

Despite the fact that in the above specific developments the nanowire was formed by sputtering or galvanic deposition, the present invention is not restricted thereto; it is also possible to use other deposition methods, e.g., vapor-phase deposition methods. Cited as an example for a ferromagnetic material whose magnetization is easily reversible was an Ni—Fe alloy in nanocrystalline and amorphous state. However, other ferromagnetic materials are usable as well, depending on the application area.

Although in the two aforementioned specific developments the nanowire in the substrate has a perpendicular orientation, i.e., in the z-direction, the present invention is not restricted to such; oblique or horizontal nanowires also may be provided in such magnet field sensor devices.

Notwithstanding the fact that in the above specific developments the nanowire has a homogeneous composition of Ni—Fe, through varying deposition processes it is also possible to provide a nanowire, which has a multi-layer structure of different materials in the longitudinal direction.

What is claimed is:

1. A magnetic field sensor device, comprising:
    a substrate, which has a trench;
    a ferromagnetic nanowire formed in the trench;
    a first electrical connection for electrically connecting a first end of the ferromagnetic nanowire;
    a second electrical connection for electrically connecting a second end of the ferromagnetic nanowire; and
    a magnetic field detection device for detecting a magnetic field in a region of the nanowire.

2. The magnetic field sensor device of claim 1, further comprising:
    a current generation device, which is connected to the first electrical connection and to the second electrical connection, for generating an alternating current for reversing the magnetization of the nanowire.

3. The magnetic field sensor device of claim 1, wherein the magnetic field detection device includes a pickup coil.

4. The magnetic field sensor device of claim 3, wherein the nanowire is guided into a pedestal formed above a top surface of the substrate, and wherein the pickup coil on the top surface is guided around the pedestal.

5. The magnetic field sensor device of claim 4, wherein the nanowire is guided into the pedestal perpendicularly, and wherein the pickup coil includes a planar coil mounted on the top surface.

6. The magnetic field sensor device of claim 1, wherein the magnetic field detection device has a spin valve.

7. The magnetic field sensor device of claim 3, wherein the nanowire is routed into a pedestal formed above the top surface of the substrate, and wherein the spin valve is provided inside the pedestal.

8. The magnetic field sensor device of claim 7, wherein the nanowire is guided into the pedestal perpendicularly and has a bend above the top surface such that a region of the nanowire situated in the vicinity of the second end extends parallel to the top surface.

9. The magnetic field sensor device of claim 8, wherein the spin valve is provided in the pedestal, underneath the region.

10. The magnetic field sensor device of claim 1, wherein the nanowire is made of one of nanocrystalline Ni—Fe and amorphous Ni—Fe.

11. The magnetic field sensor device of claim 1, wherein the first electrical connection is connected to the first end of the ferromagnetic nanowire via at least one buried circuit track.

12. A production method for producing a magnetic field sensor device, the method comprising:
    providing a substrate, which has a trench;
    forming a ferromagnetic nanowire in the trench by at least one deposition process;
    forming a first electrical connection and at least one buried circuit track for the electrical connection of a first end of the ferromagnetic nanowire;
    forming a second electrical connection for the electrical connection of a second end of the ferromagnetic nanowire; and
    forming a magnetic field detection device for detecting a magnetic field in the region of the nanowire.

* * * * *